United States Patent
Keller et al.

(10) Patent No.: US 11,557,665 B2
(45) Date of Patent: Jan. 17, 2023

(54) VERTICAL HIGH-BLOCKING III-V BIPOLAR TRANSISTOR

(71) Applicant: AZUR SPACE Solar Power GmbH, Heilbronn (DE)

(72) Inventors: Gregor Keller, Heilbronn (DE); Clemens Waechter, Lauffen am Neckar (DE); Daniel Fuhrmann, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 23 days.

(21) Appl. No.: 17/368,279

(22) Filed: Jul. 6, 2021

(65) Prior Publication Data
US 2022/0005942 A1    Jan. 6, 2022

(30) Foreign Application Priority Data
Jul. 6, 2020    (DE) ...................... 10 2020 004 051.9

(51) Int. Cl.
*H01L 29/737* (2006.01)
*H01L 29/08* (2006.01)
(Continued)

(52) U.S. Cl.
CPC ...... *H01L 29/7371* (2013.01); *H01L 29/0817* (2013.01); *H01L 29/0821* (2013.01); *H01L 29/1004* (2013.01); *H01L 29/205* (2013.01)

(58) Field of Classification Search
CPC ............. H01L 29/7371; H01L 29/0817; H01L 29/0821; H01L 29/1004; H01L 29/205;
(Continued)

(56) References Cited

U.S. PATENT DOCUMENTS

| 5,359,220 A | 10/1994 | Larson et al. |
| 10,032,868 B2 | 7/2018 | Benna et al. |

(Continued)

FOREIGN PATENT DOCUMENTS

| EP | 0603737 A2 | 6/1994 |
| EP | 0607935 A2 | 7/1994 |
| WO | WO2018049339 A1 | 3/2018 |

OTHER PUBLICATIONS

Alekseev et al; "DC and high-frequency performance of AlGaN/GaN Heterojunction Bipolar Transistors", Solid State Electronics, vol. 44, No. 2; Feb. 1, 2000.
(Continued)

*Primary Examiner* — Syed I Gheyas
(74) *Attorney, Agent, or Firm* — Muncy, Geissler, Olds & Lowe, P.C.

(57) ABSTRACT

A vertical high-blocking III-V bipolar transistor, which includes an emitter, a base and a collector. The emitter has a highly doped emitter semiconductor contact region of a first conductivity type and a first lattice constant. The base has a low-doped base semiconductor region of a second conductivity type and the first lattice constant. The collector has a layered low-doped collector semiconductor region of the first conductivity type with a layer thickness greater than 10 μm and the first lattice constant. The collector has a layered highly doped collector semiconductor contact region of the first conductivity type. A first metallic connecting contact layer is formed in regions being integrally connected to the emitter. A second metallic connecting contact layer is formed in regions being integrally connected to the base. A third metallic connecting contact region is formed at least in regions being arranged beneath the collector.

19 Claims, 3 Drawing Sheets

(51) Int. Cl.
*H01L 29/10* (2006.01)
*H01L 29/205* (2006.01)

(58) Field of Classification Search
CPC ......... H01L 29/41708; H01L 29/42304; H01L 29/0804
See application file for complete search history.

(56) References Cited

U.S. PATENT DOCUMENTS

| | | |
|---|---|---|
| 2004/0164319 A1 | 8/2004 | Zampardi et al. |
| 2015/0014706 A1 | 1/2015 | Sadwick |
| 2019/0067460 A1 | 2/2019 | Umemoto et al. |
| 2019/0115457 A1 | 4/2019 | Umemoto et al. |
| 2022/0208998 A1* | 6/2022 | Hoshi ............... H01L 29/66318 |

OTHER PUBLICATIONS

Mohammad; "Composition induced design 1-10 considerations for InP/Ga "xIn"-"xAs" heterojunction bipolar transistors", Solid State Electronics, vol. 46, No. 12; Dec. 1, 2002.
Kuech et al; "Metamorphic and non-conventional buffer layers", Compound Semiconductor Week May 22, 2011.
Thomas Landon et al: "Generation 2 High Voltage Heterojunction Bipolar Transistor Technology for High Efficiency Base Station Power Amplifiers" IEEE, 2010, pp. 1508-1511, ISBN: 978-1-4244-7732-6.

* cited by examiner

VERTICAL HIGH-BLOCKING III-V BIPOLAR TRANSISTOR

This nonprovisional application claims priority under 35 U.S.C. § 119(a) to German Patent Application No. 10 2020 004 051.9, which was filed in Germany on Jul. 6, 2020 and which is herein incorporated by reference.

BACKGROUND OF THE INVENTION

Field of the Invention

The present invention relates to a vertical high-blocking III-V bipolar transistor.

Description of the Background Art

In power electronics, in particular if voltages greater than 400 V must be handled, thyristors or IGBTs based on silicon or silicon carbide are usually used as switches.

However, III-V semiconductors, in particular gallium arsenide, are generally used for low blocking voltages below 20 V for the high-frequency technology in ranges above 5 GHz, due to their higher charge carrier mobility.

For example, a heterojunction bipolar transistor is known from "Generation 2 High Voltage Heterojunction Bipolar Transistor Technology for High Efficiency Base Station Power Amplifiers," T. Landon et al., 2010 IEEE MTT-S International Microwave Symposium, CD-ROM ISBN: 978-1-42447732-6, DOI: 10.1109/MWSYM.2010.5514779, for a working frequency of 2.1 GHz and having an InGaP/GaAs junction and an operating voltage of 32 V. The base-collector breakdown voltage was able to be increased to 85 V. Bipolar transistors of this type are preferably used for Doherty applications in mobile radio base stations.

IGBTs having a particularly large band gap based on GaN are known from EP 0 603 737 A2.

IGBTs including hybrid bipolar/field-effect transistors are known from US 2015/0 014 706 A1.

SUMMARY OF THE INVENTION

It is therefore an object of the present invention to provide a device which refines the prior art.

According to an exemplary embodiment of the invention, a vertical high-blocking III-V bipolar transistor is provided, which includes an emitter, a base and a collector.

The emitter has a highly doped emitter semiconductor contact region of a first conductivity type with a dopant concentration greater than $1 \cdot 10^{18}$ cm$^{-3}$ and a first lattice constant.

The base has a low-doped base semiconductor region of a second conductivity type and the first lattice constant.

The collector has a layered low-doped collector semiconductor region of the first conductivity type with a layer thickness greater than 10 µm and the first lattice constant.

The collector also has a layered highly doped collector semiconductor contact region of the first conductivity type with a dopant concentration greater than $1 \cdot 10^{18}$ cm$^{-3}$.

The aforementioned semiconductor regions and semiconductor contact regions can be arranged in the specified sequence.

A first metallic connecting contact layer formed in regions is integrally connected to the emitter, and a second metallic connecting contact layer formed in regions is integrally connected to the base.

Moreover, a third metallic connecting contact layer formed at least in regions is arranged beneath the collector to electrically connect the collector.

The emitter semiconductor contact region, the base semiconductor region and the collector semiconductor region each comprise a III-V material or are made of a III-V material.

It is understood that the metallic connecting contact layers are completely or partially made of a metal, e.g., Au and/or Pd and/or Ge, in particular an alloy.

The semiconductor regions and semiconductor contact regions are preferably partially or completely epitaxially generated, e.g., with the aid of MOVPE or with the aid of LPE.

It should be noted that the expression III-V material can be understood to be a compound made of III-V elements.

It should furthermore be noted that the expression, "low-"doped base region is understood to be a concentration of dopants in a range between $1 \cdot 10^{15}$ cm$^{-3}$ and $1 \cdot 10^{17}$ cm$^{-3}$. The base preferably has a thickness between 0.1 µm and 5 µm, or is in a range between 0.2 µm and 0.5 µm. In one refinement, the base has a gradient in the dopant profile. The gradient is preferably provided with a continuous design. It is understood that, when forming a dopant gradient in the base, the emitter-side doping of the base layer is greater than the collector-side doping of the base layer.

It is understood that a semiconductor region or semiconductor contact region made of a III-V material, in particular GaAs or AlGaAs or InGaAs or of AlInGaAs or InGaP or AlInGaAs includes not only the aforementioned III-V materials but also always includes dopants in a range between $1 \cdot 10^{12}$ cm$^{-3}$ and $5 \cdot 10^{20}$ cm$^{-3}$. It should further be noted that the semiconductor contact regions and the semiconductor regions may also include impurities, such as O.

It is furthermore understood that the expression "comprises a III-V material" of the particular semiconductor region or semiconductor contact region may include not only III-V compounds such as GaAs or AlGaAs or InGaAs or AlInGaAs or InGaP or AlInGaAs but also other elements from the III-V group, in particular Al, P, In.

An advantage is that, with the aid of the at least 10 µm thick, low-doped collector semiconductor region, a high operating voltage above 50 V and a high base-collector breakdown voltage above 200 V may be achieved with a frequency limit above 1 GHz. In other words, the overwhelming portion of the space-charge zone extends into the portion of the low-doped collector semiconductor region.

Another advantage is that the collector may be connected from the back side. In particular, if the third metallic connecting contact layer is formed over the entire surface, a lower connection resistance may be achieved. In one specific embodiment, the thermal coupling may be significantly improved by integrally arranging the third metallic connecting contact layer directly on a metallic carrier.

It has surprisingly been shown that a vertical high-blocking transistor having a high switching frequency may be reliably and cost-effectively formed. In particular, it has been shown that, in contrast to the silicon components, the technological challenges in the III-V compounds have up to now been completely different, so that it has not been possible to transfer the component structures from silicon to III-V.

The emitter can have a highly doped emitter intermediate layer of the first conductivity type. The emitter intermediate layer is arranged between the emitter semiconductor contact region and the base semiconductor region and has a dopant concentration greater than $1 \cdot 10^{18}$ N/cm$^{-3}$ and a first band gap energy. The base semiconductor region has a second band gap energy, the first band gap energy being greater than the second band gap energy.

Due to the hetero-barrier between the base and emitter, a base-emitter hole current is suppressed, and the amplification of the transistor is increased hereby. The barrier results in a greater amplification by a factor of $\exp(-_\Delta E_g/kT)$. Heterostructure bipolar transistors (HBT) of this type are therefore also referred to as super beta HBTs. The doping of the base and the switching speed may be increased hereby. It is understood that the amplification results from the ratio between the electron current injected by the emitter into the base and the hole current injected by the base into the emitter.

The collector can include a highly doped collector intermediate layer of the second conductivity type, the collector intermediate layer being arranged between the base semiconductor region and the collector semiconductor region, having a dopant concentration less than $5 \cdot 10^{17}$ cm$^{-3}$ and a third band gap energy, the base semiconductor region having a second band gap energy, and the third band gap energy being greater than the second band gap energy. In one refinement, the collector intermediate layer is arranged between the base semiconductor region and the collector semiconductor region and has a dopant concentration less than $1 \cdot 10^{17}$ cm$^{-3}$. The dopant concentration of the collector semiconductor layer is preferably greater than $1 \cdot 10^{14}$ cm$^{-3}$ or greater than $1 \cdot 10^{15}$ cm$^{-3}$.

The heterojunction between the collector and the base prevents the occurrence of hole injection from the base into the collector and correspondingly also results in an increase in the amplification.

Due to a combination of the heterojunction between the base and the collector with the heterojunction between the base and the emitter, a so-called dual-junction HBT is formed, i.e. an HBT with two heterojunctions, which, in particular, has the advantage described above of higher switching speeds.

The base semiconductor region can comprise GaAs or is made of GaAs, and the emitter intermediate layer and/or the collector intermediate layer comprises InGaP or AlGaAs or is made of InGaP or AlGaAs.

The collector semiconductor region can be designed as a substrate layer.

The bipolar transistor can comprise a semiconductor substrate region, the semiconductor substrate region being arranged between the third metallic connecting contact layer and the collector semiconductor contact region.

The bipolar transistor can comprise a metamorphic buffer layer sequence of the first conductivity type. which has a layer thickness of more than 0.5 µm and less than 20 µm, the metamorphic buffer layer sequence having an upper side with a first lattice constant and an underside with a second lattice constant and being arranged between the collector semiconductor region and the collector semiconductor contact region or beneath the collector semiconductor contact region or being designed as a collector semiconductor contact region.

In an example, all semiconductor regions arranged above the metamorphic butter layer sequence can have the first lattice constant, and all semiconductor regions arranged beneath the metamorphic buffer layer sequence can have the second lattice constant and the first conductivity type.

The first conductivity type can be p and the second conductivity type can be n, or the first conductivity type is n and the second conductivity type is p. Both vertical pnp structures and vertical npn structures may be formed hereby.

At least the emitter can be designed as a mesa structure having a first height H1 on a surface of the base. The mesa structure is created, for example, by means of an etching process.

The bipolar transistor can have a semiconductor region with a width B and a second height H2, the edge region extending along the edge of the surface of the base around the emitter, the first connecting contact layer and the second connecting contact layer, the second height H2 of the semiconductor edge region being less than or equal to first height H1 of the emitter, and the semiconductor edge region along second height H2 including a material corresponding to the emitter.

The edge region thus corresponds along its height to the emitter up to this height, i.e., the edge region is always made of the same material or material characteristic as the emitter along the height.

For example, if the emitter comprises an emitter intermediate layer and the emitter semiconductor contact region, according to a first specific embodiment, the edge region is made of a material corresponding to the emitter intermediate layer and has a layer thickness corresponding to the layer thickness of the emitter intermediate layer. According to a second specific embodiment, the edge region also includes two layers, the first layer adjoining the surface of the base including a material corresponding to the emitter intermediate layer, and the subsequent second layer including a material corresponding to the emitter semiconductor contact region.

The semiconductor edge region can be, for example, easily generated together with the emitter from a common source layer with the aid of an etching process.

The semiconductor edge region, which extends along the edge in a railing-like/balcony-like manner, can be used for edge passivation.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
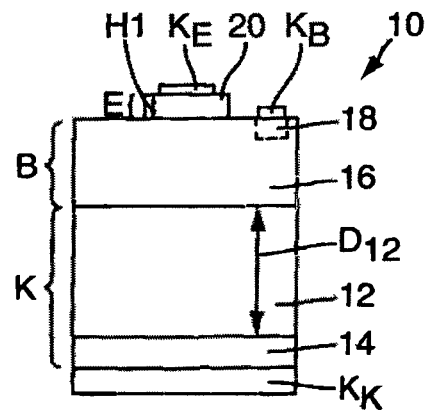
FIG. 1 shows a cross-sectional view of a vertical high-blocking III-V bipolar transistor.

The illustration in FIG. 1 shows a first specific embodiment of a vertical high-blocking III-V bipolar transistor 10, including a collector K, an emitter E and a base B and three connecting contact layers $K_K$, $K_E$ and $K_B$.

The collector comprises a low n-doped collector semiconductor region 12 and a highly n-doped collector semiconductor region 14, collector semiconductor region 12 being arranged with an underside on an upper side of collector semiconductor contact region 14, and third connecting contact layer $K_K$ covering the underside of collector semiconductor contact region 14. Connector semiconductor region 12 has a thickness D12 of at least 10 μm.

Base B comprises a low p-doped base semiconductor region 16, base semiconductor region 16 being arranged with an underside on an upper side of collector semiconductor region 12. Second connecting contact layer $K_B$ is arranged on a first partial region of an upper side of base semiconductor region 16, according to one refinement, a highly p-doped base semiconductor contact region 18 (shown by the dashed line) extending at least from the first partial region of the upper side of base semiconductor region 16 into base semiconductor region 16 in a well-shaped manner.

A highly n-doped emitter semiconductor contact region 20, which forms emitter E as a mesa structure having a first height H1, is arranged on a second partial region of the upper side of base semiconductor region 16. The first connecting contact layer $K_E$ is formed on an upper side of emitter semiconductor contact region 20.

For this purpose, transistor 10 has an npn structure and is designed in a stacked manner having layered semiconductor regions and semiconductor contact regions, emitter E having a smaller diameter than the base and the collector and being designed as a mesa emitter. It is understood that a pnp structure may also be formed.

Figure 2:
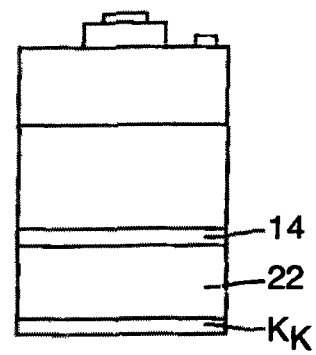
FIG. 2 shows a cross-sectional view of a vertical high-blocking III-V bipolar transistor.

A second specific embodiment is shown in the illustration in FIG. 2. Only the differences from the illustration in FIG. 1 are explained below.

The vertical high-blocking III-V semiconductor transistor includes a further semiconductor layer structure 22, further semiconductor layer structure 22 being arranged between the underside of collector semiconductor contact region 14 and third connecting contact layer $K_K$.

Further semiconductor contact structure 22 comprises a substrate or a semiconductor substrate region and/or a metamorphic buffer or a metamorphic buffer layer sequence.

Figure 3:
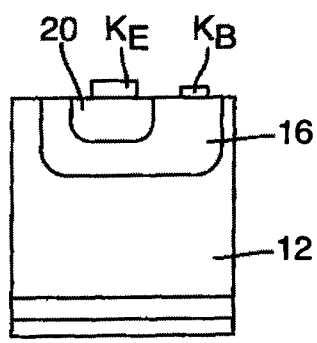
FIG. 3 shows a cross-sectional view of a vertical high-blocking III-V bipolar transistor.

A third specific embodiment is shown in the illustration in FIG. 3. Only the differences from the illustration in FIG. 1 are explained below.

The base and the emitter are provided with a well-shaped design, so that base semiconductor region 16 extends from an upper side of transistor 10 into collector semiconductor region 12, and emitter semiconductor region 20 extends into base semiconductor region 16.

Figure 4:
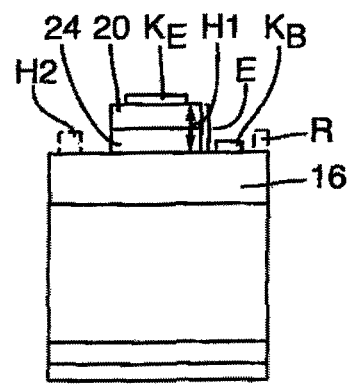
FIG. 4 shows a cross-sectional view of a vertical high-blocking III-V bipolar transistor.

A fourth specific embodiment is shown in the illustration in FIG. 4. Only the differences from the illustration in FIG. 1 are explained below.

Vertical high-blocking III-V bipolar transistor 10 is designed as a heterojunction bipolar transistor, an emitter intermediate layer 24 of the emitter, which adjoins base semiconductor region 16, being made of a material having a first band gap energy, and the first band gap energy being greater than a second band gap energy of base semiconductor region 16. Emitter intermediate layer 24 is arranged between base semiconductor region 16 and emitter semiconductor contact region 20.

In one refinement, vertical high-blocking III-V bipolar transistor 10 comprises a semiconductor edge region R having a width B and a height H2, semiconductor edge region R being arranged on the surface of base B, extending in a balcony-like manner along an edge of the surface around emitter E, first connecting contact layer $K_E$ and second connecting contact layer $K_B$. Height H2 of edge region R is less than height H1 of emitter E and corresponds to a layer thickness of emitter intermediate layer 24, the material of semiconductor edge region R corresponding to the material of emitter intermediate layer 24.

Figure 5:
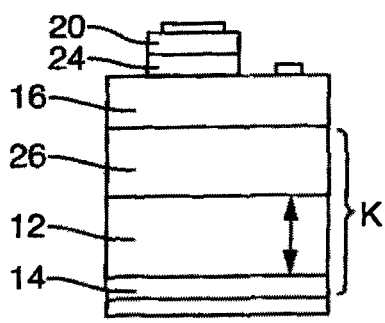
FIG. 5 shows a cross-sectional view of a vertical high-blocking III-V bipolar transistor.

A fifth specific embodiment is shown in the illustration in FIG. 5. Only the differences from the illustration in FIG. 4 are explained below.

In addition to the first heterojunction between emitter intermediate layer 24 and base semiconductor region 16, bipolar transistor 10 also includes a second heterojunction between base semiconductor region 16 and a collector intermediate layer 26 of collector K, collector intermediate layer 26 being made of a material having a third band gap energy, and the third band gab energy being greater than the second bad gap energy of base semiconductor region 16. Collector intermediate layer 26 is arranged between base semiconductor region 16 and collector semiconductor region 12 having layer thickness D12.

Figure 6:
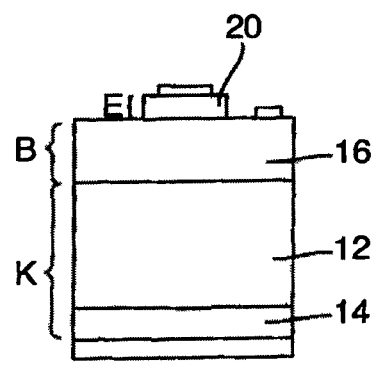
FIG. 6 shows a cross-sectional view of a vertical high-blocking III-V bipolar transistor.

A sixth specific embodiment is shown in the illustration in FIG. 6. Only the differences from the illustration in FIG. 1 are explained below.

Bipolar transistor 10 is designed as an npn transistor. Collector semiconductor contact region 14 and emitter semiconductor contact region 20 are provided with a highly n-doped design, collector semiconductor region 12 with a low n-doped design and base semiconductor region 16 with a low p-doped design.

Figure 7:
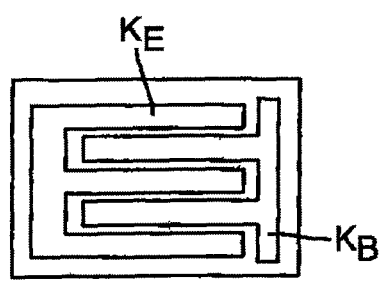
FIG. 7 shows a top view of a vertical high-blocking III-V bipolar transistor.

A top view of a further specific embodiment of the vertical high-blocking III-V bipolar transistor is shown in the illustration in FIG. 7. First connecting contact layer $K_E$ includes multiple transverse ribs connected by a longitudinal rib. Second connecting contact layer $K_B$ also includes transverse ribs connected by a longitudinal rib, the transverse ribs of second connecting contact layer $K_B$ extending into gaps between the transverse ribs of first connecting contact layer $K_E$.

Figure 8:
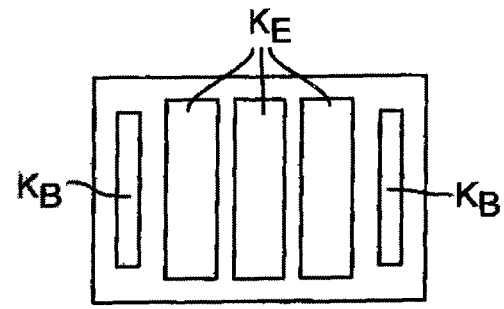
FIG. 8 shows a top view of a vertical high-blocking III-V bipolar transistor.

A top view of a further specific embodiment of the vertical high-blocking III-V bipolar transistor is shown in the illustration in FIG. 8. Only the differences from the illustration in FIG. 7 are explained below.

First connecting contact layer $K_E$ comprises three ribs running in parallel. Second connecting contact layer $E_B$ comprises two ribs, the two ribs of second connecting contact layer $E_B$ being arranged to the left and right of the ribs of first connecting contact layer $K_E$.

Figure 9:
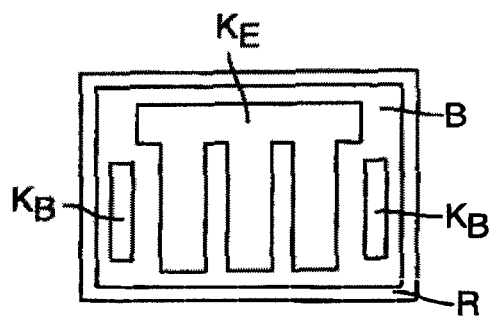
FIG. 9 shows a top view of a vertical high-blocking III-V bipolar transistor.

A top view of a further specific embodiment of the vertical high-blocking III-V bipolar transistor is shown in the illustration in FIG. 9. Only the differences from the illustration in FIG. 7 are explained below.

First connecting contact layer $K_E$ comprises multiple longitudinal ribs connected by a transverse rib. Second connecting contact layer $K_B$ comprises two ribs, the two ribs of second connecting contact layer $K_B$ being arranged to the left and right of the longitudinal ribs of first connecting contact layer $K_E$.

Semiconductor edge region R extends along the edge of the surface of base B.

Figure 10:
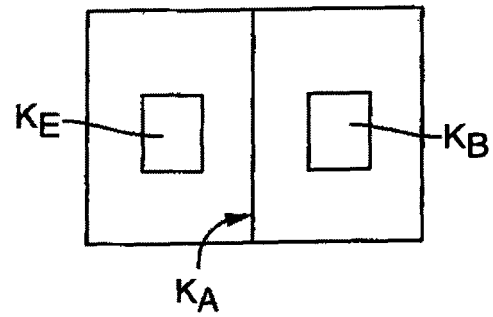
FIG. 10 shows a top view of a vertical high-blocking III-V bipolar transistor.

A top view of a further specific embodiment of the vertical high-blocking III-V bipolar transistor is shown in the illustration in FIG. 10. Only the differences from the illustration in FIG. 7 are explained below.

Both first connecting contact layer $K_E$ and second connecting contact layer $K_B$ each comprise exactly one contact surface, the contact surfaces in the illustrated top view each being situated on one side of a step KA dividing the upper side of the III-V bipolar transistor and being created, for example, by an etching process.

Figure 11:
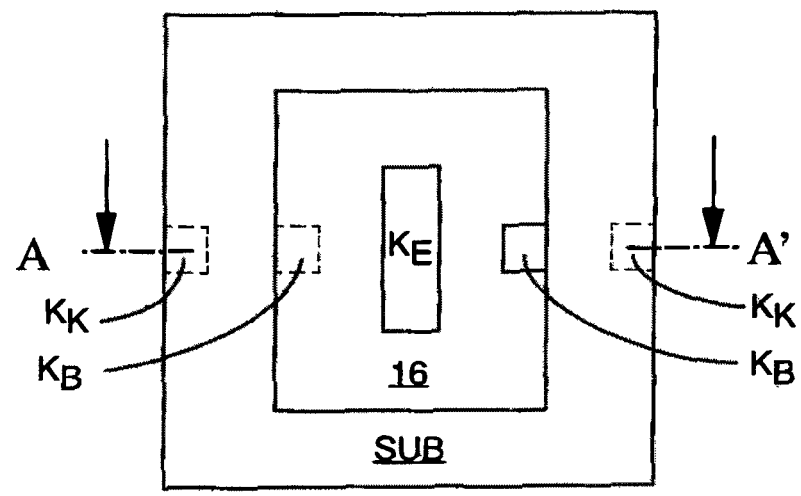
FIG. 11 shows a top view of an individual vertical high-blocking III-V bipolar transistor.

A top view of a specific embodiment of an individual vertical high-blocking III-V bipolar transistor is shown in the illustration in FIG. 11. Only the differences from the illustration in FIG. 9 are explained below.

In the case of the emitter, first connecting contact layer $K_E$ is integrally connected to emitter semiconductor contact region 20. The emitter comprises only one longitudinal rib and is completely surrounded by base semiconductor region 16. Base semiconductor region 16 is electrically connected with the aid of second connecting contact layer $K_B$. Base semiconductor region 16 optionally includes a further second connecting contact layer $K_B$—drawn as the dashed line—to improve the dynamic behavior of the transistor structure. Base semiconductor region 16 is completely surrounded by a substrate layer SUB. A low-resistance layer is optionally formed on substrate layer SUB, the low-resistance layer making it possible, by means of a high transverse conductivity, to optionally connect collector semiconductor region 12 with the aid of third connecting contact layers $K_K$—drawn as a dashed line. The dynamic properties of the transistor may be further improved hereby.

Figure 12:
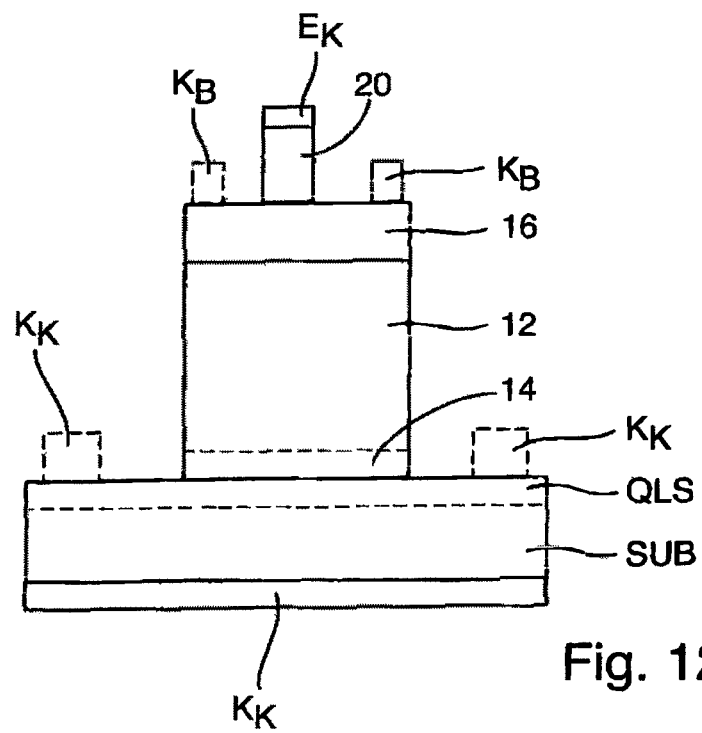
FIG. 12 shows a cross-sectional view of an individual vertical high-blocking III-V bipolar transistor shown in FIG. 11, along Line A-A'.

A cross-sectional view of the specific embodiment of the vertical high-blocking III-V bipolar transistor is illustrated in the illustration in FIG. 12, shown along Line A-A' in FIG. 11. Only the differences from the illustration in FIG. 11 are explained below.

The transistor structure is designed as a mesa structure and includes a step, due to circumferential substrate layer SUB. The collector optionally includes a collector semiconductor contact region 14 on the underside. If electrical cross-layer layer QLS and no collector semiconductor contact region 14 are formed between the collector and the substrate layer, collector semiconductor contact region 14 rests directly on substrate layer SUB. The collector is connected by the substrate layer. For this purpose, the substrate layer includes a third connecting contact layer $K_K$ on the underside, which is preferably formed over the entire surface.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A vertical high-blocking III-V bipolar transistor comprising:
    an emitter comprising a highly doped emitter semiconductor contact region of a first conductivity type with a dopant concentration greater than $1 \cdot 10^{18}$ cm$^{-3}$ and a first lattice constant;
    a base comprising a low-doped base semiconductor region of a second conductivity type and the first lattice constant, a dopant concentration of the low-doped base semiconductor region being less than $10^{17}$ cm$^{-3}$; and
    a collector comprising a layered low-doped collector semiconductor region of the first conductivity type with a layer thickness greater than 10 µm and the first lattice constant,
    wherein the collector comprises a layered highly doped collector semiconductor contact region of the first conductivity type with a dopant concentration greater than $1 \cdot 10^{18}$ cm$^3$,
    wherein the base and collector semiconductor regions and the emitter and collector semiconductor contact regions are arranged in the specified sequence,
    wherein a first connecting contact layer is integrally connected to the emitter,
    wherein a second connecting contact layer is integrally connected to the base,
    wherein a third connecting contact layer is arranged beneath the collector, and
    wherein the emitter semiconductor contact region, the base semiconductor region and the collector semiconductor region each comprise a III-V material.

2. The vertical III-V bipolar transistor according to claim 1, wherein the emitter includes a highly doped emitter intermediate layer of the first conductivity type, the emitter intermediate layer being arranged between the emitter semiconductor contact region and the base semiconductor region having a dopant concentration greater than $1 \cdot 10^{18}$ cm$^{-3}$ and a first band gap energy, the base semiconductor region having a second band gap energy, and the first band gap energy being greater than the second band gap energy.

3. The vertical III-V bipolar transistor according to claim 1, wherein the collector includes a collector intermediate layer of the second conductivity type, the collector intermediate layer being arranged between the base semiconductor region and the collector semiconductor region having a dopant concentration less than $5 \cdot 10^{17}$ cm$^{-3}$ and a third band gap energy, the base semiconductor region having a second band gap energy, and the third band gap energy being greater than the second band gap energy.

4. The vertical III-V bipolar transistor according to claim 3, wherein the base semiconductor region comprises GaAs, and the collector intermediate layer comprises InGaP or AlGaAs.

5. The vertical III-V bipolar transistor according to claim 1, wherein the collector semiconductor contact region is a substrate layer.

6. The vertical III-V bipolar transistor according to claim 1, wherein the bipolar transistor comprises a semiconductor substrate region, the semiconductor substrate region being arranged between the third connecting contact layer and the collector semiconductor contact region.

7. The vertical III-V bipolar transistor according to claim 1, wherein the bipolar transistor comprises a metamorphic buffer layer sequence of the first conductivity type, which comprises a layer thickness of more than 0.5 µm and less than 20 µm, the metamorphic buffer layer sequence having an upper side with the first lattice constant and an underside with a second lattice constant, and the metamorphic buffer layer sequence being arranged between the collector semiconductor region and the collector semiconductor contact region or beneath the collector semiconductor contact region or being designed as the collector semiconductor contact region, all semiconductor regions arranged beneath the metamorphic buffer layer sequence having the second lattice constant and the first conductivity type.

8. The vertical III-V bipolar transistor according to claim 1, wherein the first conductivity type is p and the second conductivity type is n.

9. The vertical III-V bipolar transistor according to claim 1, wherein at least the emitter is designed as a mesa structure having a first height on a surface of the base.

10. The vertical III-V bipolar transistor according to claim 9, wherein the bipolar transistor comprises a semiconductor edge region with a width B and a second height H2, the edge region extending along the edge of the surface of the base around the emitter, the first connecting contact layer and the second connecting contact layer, the second height of the semiconductor edge region being less than or equal to the first height of the emitter, and the semiconductor edge region along second height including a material corresponding to the emitter.

11. The vertical III-V bipolar transistor according to claim 1, wherein the emitter semiconductor contact region, the base semiconductor region and the collector semiconductor region each consists of a III-V material.

12. The vertical III-V bipolar transistor according to claim 1, wherein the first, second and third connecting contact layers are all metallic.

13. The vertical III-V bipolar transistor according to claim 1, wherein the first conductivity type is n and the second conductivity type is p.

14. The vertical III-V bipolar transistor according to claim 3, wherein the base semiconductor region consists of GaAs, and the collector intermediate layer consists of InGaP or AlGaAs.

15. The vertical III-V bipolar transistor according to claim 2, wherein the bipolar transistor comprises a semiconductor edge region with a width B and a height H2, the semiconductor edge region extending along the edge of the surface of the base around the emitter, the first connecting contact layer and the second connecting contact layer, the height H2 of the semiconductor edge region corresponding to a height of the emitter intermediate layer, and a material of the semiconductor edge region corresponding to a material of the emitter intermediate layer.

16. The vertical III-V bipolar transistor according to claim 1, further comprising:
 a base semiconductor contact region of the second conductivity type with a dopant concentration greater than $1 \cdot 10^{18}$ cm$^{-3}$, the base semiconductor contact region extending from a first partial region of an upper side of the base semiconductor region and extending into the base semiconductor region.

17. The vertical III-V bipolar transistor according to claim 16, wherein the second connecting contact layer is connected to the base semiconductor contact region.

18. The vertical III-V bipolar transistor according to claim 2, wherein the base semiconductor region comprises GaAs, and the emitter intermediate layer comprises InGaP or AlGaAs.

19. The vertical III-V bipolar transistor according to claim 2, wherein the base semiconductor region consists of GaAs, and the emitter intermediate layer consists of InGaP or AlGaAs.

* * * * *